US012641972B2

(12) United States Patent
Chen et al.

(10) Patent No.: US 12,641,972 B2
(45) Date of Patent: May 26, 2026

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Yong Chen, Wuhan (CN); Hong Fang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 18/262,624

(22) PCT Filed: May 31, 2023

(86) PCT No.: PCT/CN2023/097451
§ 371 (c)(1),
(2) Date: Jul. 24, 2023

(87) PCT Pub. No.: WO2024/234417
PCT Pub. Date: Nov. 21, 2024

(65) Prior Publication Data
US 2026/0059956 A1      Feb. 26, 2026

(30) Foreign Application Priority Data

May 12, 2023    (CN) .......................... 202310538406.4

(51) Int. Cl.
*H10K 59/131*          (2023.01)
(52) U.S. Cl.
CPC ................................ *H10K 59/131* (2023.02)

(58) Field of Classification Search
CPC ..................................................... H10K 59/131
See application file for complete search history.

(56) References Cited

U.S. PATENT DOCUMENTS 11,847,946 B2 * 12/2023 Lee ...................... G09G 3/3208
2022/0115463 A1 * 4/2022 Han ..................... H10K 59/124
(Continued)

FOREIGN PATENT DOCUMENTS

CN          109841181 A        6/2019
CN          113287028 A        8/2021
(Continued)

OTHER PUBLICATIONS

Korean Office Action issued in corresponding Korean Patent Application No. 10-2023-7025912 dated Jul. 10, 2025, pp. 1-10.
(Continued)

*Primary Examiner* — Victor A Mandala
(74) *Attorney, Agent, or Firm* — PV IP PC; Wei Te Chung

(57)          ABSTRACT

The present disclosure provides a display panel and a display device. The display panel includes an output terminal group, a multiplexer, a test terminal group, an input terminal group, and an organic layer provided in a chip bonding region. A first boundary of the organic layer is positioned between the multiplexer and the output terminal group, and a distance between the first boundary and the output terminal group is not less than 30 µm. A second boundary of the organic layer is positioned between the test terminal group and the input terminal group, and a distance between the second boundary and the input terminal group is not less than 30 µm.

20 Claims, 4 Drawing Sheets

(56)           References Cited

U.S. PATENT DOCUMENTS

| 2022/0335867 A1* | 10/2022 | Lee | G06F 3/044 |
| 2023/0177988 A1* | 6/2023 | Lee | H10K 59/40 |
| | | | 345/174 |
| 2024/0074298 A1* | 2/2024 | Kim | G06F 3/0412 |
| 2024/0194101 A1* | 6/2024 | Du | H10K 59/131 |

FOREIGN PATENT DOCUMENTS

| CN | 113555401 A | 10/2021 |
| CN | 113690258 A | 11/2021 |
| CN | 114864537 A | 8/2022 |
| JP | 2004029755 A | 1/2004 |
| KR | 20160120644 A | 10/2016 |
| KR | 20180105551 A | 9/2018 |
| WO | 2021226833 A1 | 11/2021 |

OTHER PUBLICATIONS

Chinese Office Action issued in corresponding Chinese Patent Application No. 202310538406.4 dated Mar. 15, 2025, pp. 1-4.
Japanese Office Action issued in corresponding Japanese Patent Application No. 特願2023-549100 dated Jul. 15, 2025, pp. 1-2.
International Search Report in International application No. PCT/CN2023/097451,mailed on Jan. 26, 2024.
Written Opinion of the International Search Authority in International application No. PCT/CN2023/097451,mailed on Jan. 26, 2024.
Chinese Office Action issued in corresponding Chinese Patent Application No. 202310538406.4 dated Nov. 8, 2024, pp. 1-6.

* cited by examiner

01

DISPLAY PANEL AND DISPLAY DEVICE

CROSS-REFERENCE TO RELATED APPLICATIONS

This application is a national stage of International Application No. PCT/CN2023/097451, filed on May 31, 2023, which claims priority to Chinese Patent Application No. 202310538406.4, filed on May 12, 2023. Both of the aforementioned applications are hereby incorporated by reference in their entireties.

TECHNICAL FIELD

The present disclosure relates to a field of display technologies, and more particularly, to a display panel and a display device.

BACKGROUND

An organic light-emitting diode (OLED) display panel has the advantages of being lighter and thinner, good in display effect, high in resolution, wide in color gamut, lower in power consumption, and capable of realizing flexible display, over a liquid crystal display. The OLED display panel has been rapidly developed in recent years and has become a preferred one of a mobile terminal.

With the development of OLED display technologies, a user has a gradually increasing requirement on performances of a display panel. In general, the limits of the OLED display panel under severe conditions of high temperature and high humidity are tested by the temperature humidity bias test (THBT, 85° C., 85% RH)/highly accelerated stress test (HAST) (so called reliability (RA) test). A disadvantage of the OLED display panel in the THBT/HAST is a peeling in a chip on panel (COP) region. The peeling in the COP region may result in an abnormal output signal, which causes the OLED display panel to generate a vertical bright line and affects the display quality of the display panel.

SUMMARY

The present disclosure provides a display panel and a display device, which can effectively solve the problems of abnormal display and reduced display quality in an OLED display panel.

In an aspect, the present disclosure provides a display panel. The display panel has a chip bonding region, and includes an output terminal group, a multiplexer, a test terminal group, and an input terminal group arranged in sequence in the chip bonding region; the display panel further includes an organic layer disposed in the chip bonding region, and the organic layer includes a first boundary and a second boundary, wherein the first boundary is positioned between the multiplexer and the output terminal group, a distance a is defined between the first boundary and the output terminal group, and the distance a is satisfied with $a \geq 30$ μm; and wherein the second boundary is positioned between the test terminal group and the input terminal group, a distance b is defined between the second boundary and the input terminal group, and the distance b is satisfied with $b \geq 30$ μm.

In an embodiment, no electrostatic protection circuit is provided between the output terminal group and the input terminal group.

In an embodiment, the organic layer positioned between the first boundary and the second boundary is continuously provided.

In an embodiment, the organic layer positioned between the first boundary and the second boundary is discontinuously provided, wherein the display panel further includes a virtual terminal group disposed in the chip bonding region, the virtual terminal group is positioned between the multiplexer and the test terminal group, and the organic layer includes a third boundary and a fourth boundary; wherein the third boundary is positioned between the multiplexer and the virtual terminal group, a distance c is defined between the third boundary and the virtual terminal group, and the distance c is satisfied with $c > m/6$, wherein m is a distance between the third boundary and the first boundary; wherein the fourth boundary is positioned between the test terminal group and the virtual terminal group, and a distance d is defined between the fourth boundary and the test terminal group, and the distance d is satisfied with $d > n/6$, wherein n is a distance between the fourth boundary and the second boundary.

In an embodiment, the virtual terminal group includes a plurality of virtual terminals, and the plurality of virtual terminals defines a plurality of virtual terminal rows, wherein the distance c and the distance d are satisfied with $c = d \geq 50$ μm.

In an embodiment, no organic layer is provided between any two adjacent rows of the virtual terminals.

In an embodiment, the virtual terminal group includes a plurality of virtual terminals, the plurality of virtual terminals defines one virtual terminal row, wherein the distance c and the distance d are satisfied with $c = d \geq 80$ μm.

In an embodiment, the distance a, the distance b, the distance c, and the distance d are satisfied with $a = b = c = d$.

In an embodiment, the organic layer is integrally formed.

In another aspect, the present disclosure provides a display device including a housing and the display panel according to the above, wherein the housing has an accommodating space in which the display panel is disposed.

BENEFICIAL EFFECT

The present disclosure provides a display panel and a display device. The display panel has a chip bonding region, and includes an output terminal group, a multiplexer, a test terminal group, and an input terminal subgroup arranged in sequence in the chip bonding region. The display panel further includes an organic layer disposed in the chip bonding region, and the organic layer including a first boundary and a second boundary. The first boundary is positioned between the multiplexer and the output terminal group, and a distance a is defined between the first boundary and the output terminal group, wherein the distance a is satisfied with $a \geq 30$ μm. The second boundary is positioned between the test terminal group and the input terminal group, and a distance b is defined between the second boundary and the input terminal group is b, wherein the distance b is satisfied with $b \geq 30$ μm. The display panel and the display device provided in the present disclosure can make improvement on the peeling of the film layers in the chip bonding region, thereby reducing abnormal chip output signals caused by the peeling of the film layers, and improving the display quality.

BRIEF DESCRIPTION OF THE DRAWINGS

In order that the technical solution in the embodiments of the present disclosure may be explained more clearly, descriptions will now be made briefly to the accompanying drawings required for the description of the embodiments. It should be understood that the accompanying drawings in the following description are merely some of the embodiments of the present disclosure, and other drawings may be made to those skilled in the art without involving any inventive effort.

Figure 1:
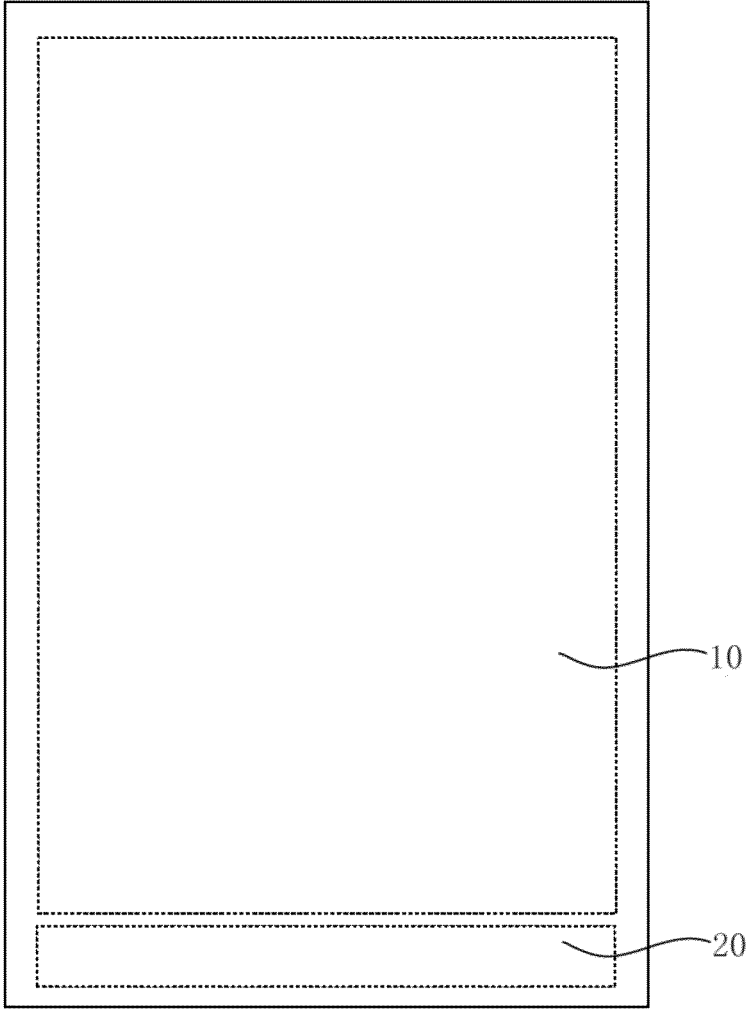
FIG. 1 is a schematic diagram of a display region and a chip bonding region of a display panel according to a first embodiment of the present disclosure.

REFERENCE NUMERALS display panel 01; display region 10; chip bonding region 20; output terminal group 21; multiplexer 22; test terminal group 23; input terminal group 24; virtual terminal group 25; virtual terminal 251; substrate 100; first conductive layer 110; interlayer dielectric layer 120; second conductive layer 130; organic layer 140; first boundary 141; second boundary 142; third boundary 143; fourth boundary 144; third conductive layer 150; passivation layer 160; fourth conductive layer 170.

DETAILED DESCRIPTION OF THE EMBODIMENTS

In the following, the technical solutions in the embodiments of the present disclosure will be clearly and completely described in connection with the accompanying drawings. It should be understood that the described embodiments are merely a part of the embodiments of the present disclosure, rather than all the embodiments. Based on the embodiments in the present disclosure, all other embodiments obtained by a person skilled in the art without involving any inventive effort are within the scope of the present disclosure. Furthermore, it should be understood that the specific embodiments described herein are for purposes of illustration and explanation only and are not intended to limit the disclosure. In the present disclosure, without contrary illustration, the use of positional terms such as "on" and "under" generally describes a position on or under the device in actual use or operation and refers to the direction in the drawings. The terms "in" and "out" refer to a position relative to a profile of the device.

The following provides many different embodiments or examples for implementing the different structures of the present disclosure. In order to simplify the description of the present disclosure, components and arrangements of specific embodiments are described below, which are merely for illustration and explanation and are not intended to limit the disclosure. In addition, the present disclosure may repeat reference numerals and/or reference letters are applied to different embodiments for the purpose of simplicity and clarity, without indicating a relationship between the various embodiments and/or arrangements discussed. In addition, the present disclosure provides examples of various specific processes and materials, but one of ordinary skill in the art will recognize the disclosure of other processes and/or the use of other materials. In the following detailed description, it should be understood that the order in which the following embodiments are described is not intended to limit the preferred orders.

FIG. 1 is a schematic diagram of a display region and a chip bonding region of a display panel according to a first embodiment of the present disclosure. Referring to FIG. 1, a first embodiment of the present disclosure provides a display panel 01 having a display region 10 and a chip bonding region 20. The display region 10 includes a plurality of data lines and a plurality of scan lines, orthographic projections of the data lines and the scan lines on the display region 10 are in a cross manner. The chip bonding region 20 is referred to as a bonding region, and is provided with a plurality of electrical components, such as a bonding terminal, a test terminal, a multiplexer, and the like. The number of electrical components of the same type may be a plurality, and the plurality of electrical components of the same type may define an electrical component group. The bonding terminal is electrically connected to the chip, the data line and/or the scan line of the display panel 01 by a bonding process. Illustratively, the bonding terminal may be an input terminal electrically connected to the chip, an output terminal electrically connected to the data line and/or the scan line, and the input terminal and the output terminal are different types of electrical components. The test terminal is electrically connected to the test circuit during the manufacturing process of the display panel 01 to detect the display performance of the display panel 01. The multiplexer is configured to implement a multiplexing function to simplify the circuit structure of the display panel 01.

Figure 2:
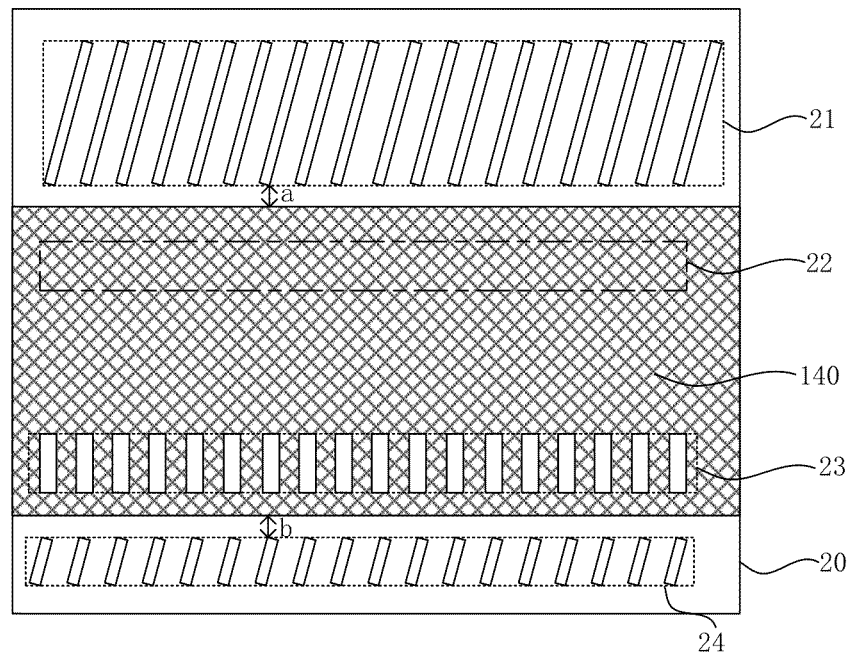
FIG. 2 is a schematic diagram of an electrical element and an organic layer in a chip bonding region according to a first embodiment of the present disclosure.
Figure 3:
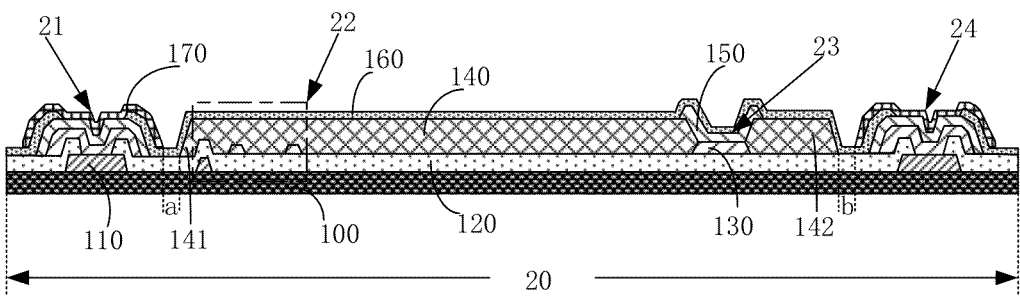
FIG. 3 is a schematic diagram of a film layer of a display panel according to a first embodiment of the present disclosure.

FIG. 2 is a schematic diagram of an electrical element and an organic layer in a chip bonding region according to a first embodiment of the present disclosure; and FIG. 3 is a schematic diagram of a film layer of a display panel according to a first embodiment of the present disclosure. As shown in FIG. 1 to FIG. 3, in some embodiments of the present disclosure, the display panel 01 has a chip bonding region 20. The display panel 01 includes an output terminal group 21, a multiplexer 22, a test terminal group 23, and an input terminal group 24 arranged in sequence in the chip bonding region 20. The display panel 01 further includes an organic layer 140 disposed in the chip bonding region 20, and the organic layer 140 includes a first boundary 141 and a second boundary 142. The first boundary 141 is positioned between the multiplexer 22 and the output terminal group 21, a distance a is defined between the first boundary 141 and the output terminal group 21, and the distance a is satisfied with $a \geq 30$ μm. The second boundary 142 is positioned between the test terminal group 23 and the input terminal group 24, a distance b is defined between the second boundary 142 and the input terminal group 24, and the distance b is satisfied with $b \geq 30$ μm.

In the related art, when a bonding process is performed, bonding terminals and/or other terminals need to be pressed. Since the terminal generally has a certain thickness, the deformation occurs as the terminal is pressed during the pressing process. The deformation pulls the film layers in the vicinity of the terminal, thereby causing a peeling or a tendency to peeling between the film layers. Because the THBT/HAST needs a high-temperature and high-humidity environment, the peeling between the film layers is further worse. As such, the chip output signal is abnormal, and the OLED display panel generates vertical bright lines, which affects the display quality of the display panel 01.

A large number of experiments is taken to find that the organic layer 140 plays a key role in peeling and is most easily to cause peeling. In the display panel 01 provided in the present disclosure, the distance between the first boundary 141 and the output terminal group 21 is not less than 30 μm, it is possible to keep the distance between the first boundary 141 and the output terminal in the output terminal group 21 above a minimum safe value. Therefore, during bonding the output terminal group 21, it is possible to improve the peeling due to the fact that the output terminal in the output terminal group 21 is pressed to deform and to pull the first boundary 141. As such, the probability of abnormal chip output signals is reduced and the display quality of the display panel 01 is improved. Meanwhile, the distance between the second boundary 142 and the input terminal group 24 is not less than 30 μm, it is possible to keep the distance between the second boundary 142 and the input terminal in the input terminal group 24 above a minimum safe value. Therefore, during bonding the input terminal group 24, it is possible to improve the peeling due to the fact that the input terminal in the input terminal group 24 is pressed to deform and to pull the second boundary 142. As such, the probability of abnormal chip output signals is reduced and the display quality of the display panel 01 is improved.

Illustratively, the output terminal group 21, the multiplexer 22, the test terminal group 23, and the input terminal group 24 are arranged in a first direction parallel to the data line. The output terminal group 21 includes a plurality of output terminals, and the plurality of output terminals are sequentially arranged in a second direction. The test terminal group 23 includes a plurality of test terminals, and the plurality of test terminals are sequentially arranged in the second direction. The input terminal group 24 includes a plurality of input terminals, and the plurality of input terminals are sequentially arranged in the second direction. The first direction and the second direction are in crossed manner in the chip bonding region 20.

In some embodiments of the present disclosure, no electrostatic protection circuit is provided between the output terminal group 21 and the input terminal group 24.

In the related art, the chip bonding region 20 is often also provided with an electrostatic protection circuit, and the electrostatic protection circuit has a large layout area, which reduces the distance between the terminal and the organic layer 140. In the display panel 01 provided in the present disclosure, no electrostatic protection circuit is provided between the output terminal group 21 and the input terminal group 24, as such, the layout area for other electrical components between the output terminal group 21 and the input terminal group 24 can be increased, and the freedom on the layout is greatly improved. Thus, the distance between the first boundary 141 and the output terminal group 21 is not less than 30 μm, and the distance between the second boundary 142 and the input terminal group 24 is not less than 30 μm.

In some embodiments of the present disclosure, the organic layer 140 positioned between the first boundary 141 and the second boundary 142 is continuously provided.

In the display panel provided in the present disclosure, the organic layer 140 positioned between the first boundary 141 and the second boundary 142 is continuously provided, so that integrity and stability of the organic layer 140 can be enhanced.

In some embodiments of the present disclosure, the distance a is equal to the distance b, i.e., a=b.

In the display panel 01 provided in the present disclosure, the distance a is equal to the distance b, i.e., a=b. That is, the distance between the first boundary 141 and the output terminal group 21 is equal to the distance between the second boundary 142 and the input terminal group 24, so that the consistency in the film layers of the display panel 01 can be improved, the production efficiency can be improved, and the effect of reducing the production cost of the display panel 01 can be achieved.

In some embodiments of the present disclosure, the display panel 01 includes a substrate 100, a first conductive layer 110, an interlayer dielectric layer 120, a second conductive layer 130, an organic layer 140, a third conductive layer 150, a passivation layer 160, and a fourth conductive layer 170 stacked in sequence in the chip bonding region 20.

Alternatively, the substrate 100 may be a flexible substrate or a rigid substrate. The material of the substrate 100 may be an organic material or an inorganic material, which is not limited in the present disclosure. The first conductive layer 110 is provided, for example, in the same layer with a gate layer of the display region 10; and the gate layer includes a gate. The second conductive layer 130 is provided, for example, in the same layer as a first source-drain layer of the display region 10; and the first source-drain layer includes a first source electrode and a first drain electrode. The third conductive layer 150 is provided, for example, in the same layer as a second source-drain layer of the display region 10; and the second source-drain layer includes a second source and a second drain.

In some embodiments of the present disclosure, the organic layer 140 covers the multiplexer 22 to protect components in the multiplexer 22. The organic layer 140 does not cover the test terminals for a worker to test the display panel 01 through the test terminals during the manufacture of the display panel 01.

In some embodiments of the present disclosure, the organic layer 140 is integrally formed.

In the related art, the organic layer 140 of the chip bonding region 20 has a double-film structure, and the double-film structure increases the thickness of the organic layer 140, provides the complexity, increases the peeling risk of the organic layer 140 in the bonding process, and increases the upper expansion limit in the high-temperature and high-humidity environment provided by the THBT/HAST. In the display panel 01 provided in the present disclosure, since the organic layer 140 is integrally formed, the organic layer 140 has a single-film structure. As such, the strain difference between the organic layer 140 and the other film layers in the THBT/HAST or in the bonding process can be reduced.

Figure 4:
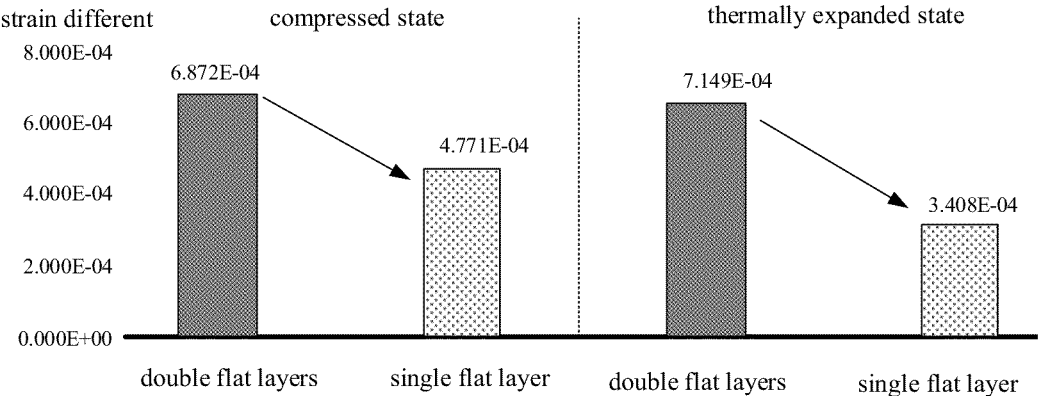
FIG. 4 is a simulation data diagram of a strain difference between an organic layer and an interlayer dielectric layer in a compressed and thermally expanded state according to a first embodiment of the present disclosure.

FIG. 4 is a simulation data diagram of a strain difference between an organic layer and an interlayer dielectric layer in a compressed and thermally expanded state according to a first embodiment of the present disclosure. As can be seen from FIG. 4, in a case that the organic layer 140 has a double-film structure, the strain difference between the organic layer 140 and the interlayer dielectric layer 120 in the display panel 01 is as high as 6.872E-04 in the compressed state during bonding. In a case that the organic layer 140 has a single-film structure, the strain difference between the organic layer 140 and the interlayer dielectric layer 120 in the display panel 01 is merely 4.771E-04, and the strain difference is greatly reduced. In a case that the organic layer 140 has a double-film structure, the strain difference between the organic layer 140 and the interlayer dielectric layer 120 in the display panel 01 is up to 7.149E-04 in the thermal expanded state during the THBT/HAST. However, in a case that the organic layer 140 has a single-film structure, the strain difference between the organic layer 140 and the interlayer dielectric layer 120 in the display panel 01 is just 3.408E-04, and the strain difference is greatly reduced.

In some embodiments of the present disclosure, the organic layer 140 has a thickness of less than or equal to 4 μm.

Specifically, in the related art, since the thickness of each sub-film layer of the organic layer 140 in the chip bonding region 20 is more than 2 μm, thus, the thickness of the organic layer 140 of the double-film layer structure is more than 4 μm. By reducing the thickness of the organic layer 140 of the present disclosure, the strain difference between the organic layer 140 and other film layers in the bonding process or in the THBT/HAST is further reduced.

On the other hand, the present disclosure further provides a display device including a housing and the display panel 01 according to the above, wherein the housing has an accommodating space in which the display panel 01 is disposed.

Embodiment 2

Figure 5:
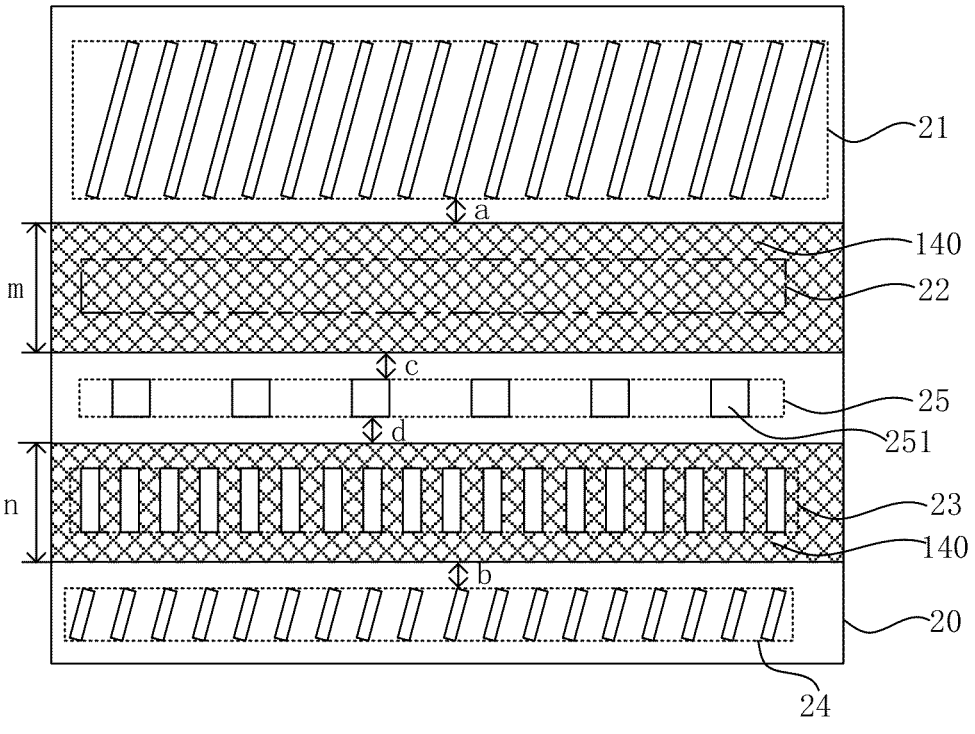
FIG. 5 is a schematic diagram of an electrical component and an organic layer in a chip bonding region according to a second embodiment of the present disclosure.
Figure 6:
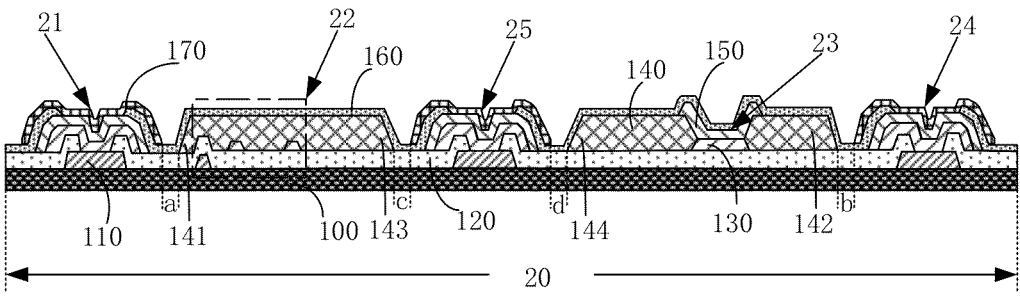
FIG. 6 is a schematic diagram of a film layer of a display panel according to a second embodiment of the present disclosure.

FIG. 5 is a schematic diagram of an electrical component and an organic layer in a chip bonding region according to a second embodiment of the present disclosure; and FIG. 6 is a schematic diagram of a film layer of a display panel according to a second embodiment of the present disclosure. As shown in FIG. 1, FIG. 5, and FIG. 6, the second embodiment of the present disclosure provides a display panel 01 and a display device. The display panel 01 has a chip bonding region 20, and includes an output terminal group 21, a multiplexer 22, a test terminal group 23, and an input terminal group 24 arranged in sequence in the chip bonding region 20. The display panel 01 further includes an organic layer 140 disposed in the chip bonding region 20, the organic layer 140 includes a first boundary 141 and a second boundary 142. The first boundary 141 is positioned between the multiplexer 22 and the output terminal group 21, a distance a is defined between the first boundary 141 and the output terminal group 21, and the distance a is satisfied with a≥30 μm. The second boundary 142 is positioned between the test terminal group 23 and the input terminal group 24, a distance b is defined between the second boundary 142 and the input terminal group 24, and the distance b is satisfied with b≥30 μm. The display device includes a housing and the display panel 01, wherein the housing has an accommodating space in which the display panel 01 is disposed.

It should be noted that the structure of the display panel 01 and the display device provided in the second embodiment of the present disclosure is similar to the structure of the display panel 01 and the display device provided in the first embodiment of the present disclosure, and details of the same parts are not described in second embodiment of the present disclosure.

In the second embodiment of the present disclosure, the organic layer 140 positioned between the first boundary 141 and the second boundary 142 is discontinuously provided. The display panel 01 further includes a virtual terminal group 25 disposed in the chip bonding region 20, the virtual terminal group 25 is positioned between the multiplexer 22 and the test terminal group 23. The organic layer 140 includes a third boundary 143 and a fourth boundary 144, wherein the third boundary 143 is positioned between the multiplexer 22 and the virtual terminal group 25, and a distance c is defined between the third boundary 143 and the virtual terminal group 25, wherein the distance c is satisfied with c>m/6, m is a distance between the third boundary 143 and the first boundary 141. The fourth boundary 144 is positioned between the test terminal group 23 and the virtual terminal group 25, a distance d is defined between the fourth boundary 144 and the test terminal group 23, wherein the distance d is satisfied with d>n/6, and n is a distance between the fourth boundary 144 and the second boundary 142.

In the related art, the virtual terminal group 25 is functioned to serve as an auxiliary support during a bonding process. It is found that the virtual terminal group 25 is positioned between the multiplexer 22 and the test terminal group 23, as such, it is easier to pull the organic layer 140 positioned in the vicinity of the virtual terminal group 25 during bonding and pressing, and the organic layer 140 is peeled off at the third boundary 143 and the fourth boundary 144.

The present disclosure is specially designed according to a special position of the virtual terminal group 25 so that the distance between the third boundary 143 and the virtual terminal group 25 is not less than one-sixth of the distance between the third boundary 143 and the first boundary 141, the distance between the fourth boundary 144 and the virtual terminal group 25 is not less than one-sixth of the distance between the fourth boundary 144 and the second boundary 142. Thus, the distance between the third boundary 143 and the virtual terminal 251 in the virtual terminal group 25 can be kept above a safe value, and the distance between the fourth boundary 144 and the virtual terminal 251 in the virtual terminal group 25 can be kept above a safe value. Therefore, during bonding the output terminal group 21 with the input terminal group 24, the problem of peeling caused by the virtual terminal 251 in the virtual terminal group 25 being subjected to compression deformation to pull the third boundary 143 and the fourth boundary 144 can be mitigated, thereby reducing the probability of abnormal chip output signals and improving the display quality of the display panel 01.

In some embodiments of the present disclosure, the virtual terminal group 25 includes a plurality of virtual terminals 251, and the plurality of virtual terminals 251 defines a plurality of virtual terminal rows, wherein c=d≥50 μm, and m/6 and n/6 are each less than 50 μm.

In the display panel 01 provided in the present disclosure, the plurality of virtual terminals 251 defines the plurality of virtual terminal rows, the virtual terminal row closest to the output terminal group 21 can serve as an auxiliary support during bonding the output terminal, and the virtual terminal row closest to the input terminal group 24 may serve as an auxiliary support during bonding the input terminal.

In the display panel 01 provided in the present disclosure, since the distance c and the distance d are satisfied with c=d≥50 μm, the distance between the third boundary and the virtual terminal group, and the distance between the fourth boundary and the test terminal group are d and are far beyond the safe value 30 μm in the first embodiment. It is possible to mitigate the peeling problem caused by the virtual terminal group being compressed and deformed more, thereby improving the stability of the display panel.

Further, since the distance c and the distance d are satisfied with c=d, that is, the distance between the third boundary 143 and the output terminal group 21 is equal to the distance between the fourth boundary 144 and the input terminal group 24, it is possible to improve the consistency of the film layers of the display panel 01, thereby improving the production efficiency, achieving the effect of reducing the production cost of the display panel 01.

In some embodiments of the present disclosure, no organic layer 140 is provided between any two adjacent rows of the virtual terminals.

In the display panel 01 provided in the present disclosure, since no organic layer 140 is provided between any two adjacent rows of the virtual terminals, the possibility of peeling the film layer when the region between two adjacent virtual terminal rows is compressed and thermally expanded can be greatly reduced.

Further, the distance a, the distance b, the distance c, and the distance d are satisfied with a=b=c=d.

In the display panel 01 provided in the present disclosure, the distance a, the distance b, the distance c, and the distance d are satisfied with a=b=c=d, that is, the distance between the first boundary 141 and the output terminal group 21, the distance between the second boundary 142 and the input terminal group 24, the distance between the third boundary 143 and the virtual terminal group 25, and the distance between the fourth boundary 144 and the test terminal group 23 are all equal. As such, the consistency of the film layers of the display panel 01 can be improved, the production efficiency can be improved, and the production cost of the display panel 01 can be reduced.

Embodiment 3

Figure 7:
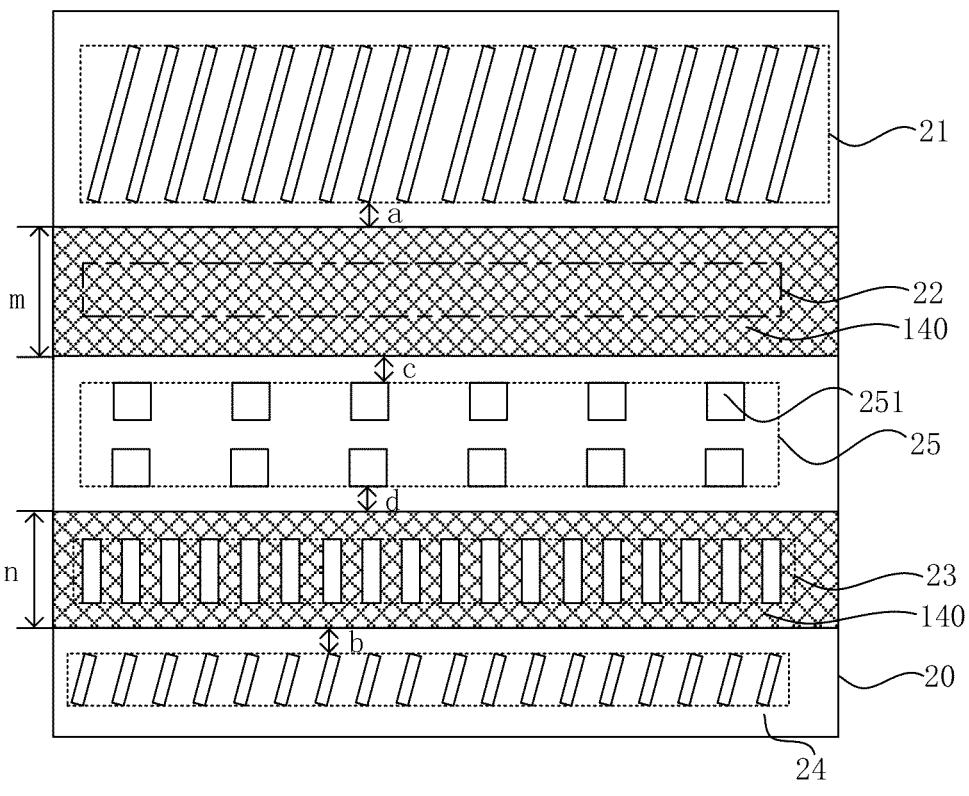
FIG. 7 is a schematic diagram of an electrical element and an organic layer in a chip bonding region according to a third embodiment of the present disclosure.
Figure 8:
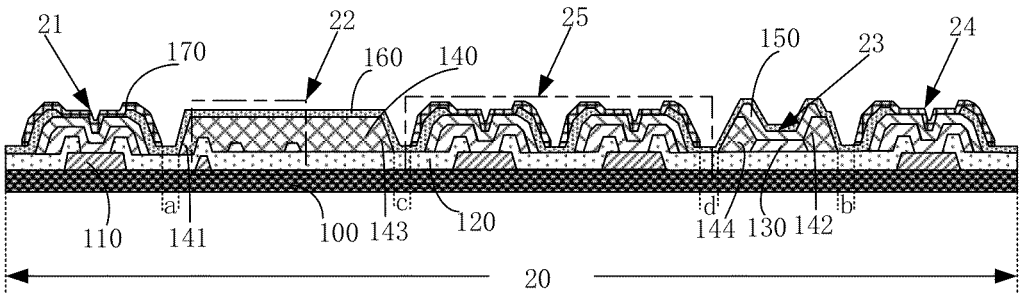
FIG. 8 is a schematic diagram of a film layer of a display panel according to a third embodiment of the present disclosure.

FIG. 7 is a schematic diagram of an electrical element and an organic layer in a chip bonding region according to a third embodiment of the present disclosure; and FIG. 8 is a schematic diagram of a film layer of a display panel according to a third embodiment of the present disclosure. As shown in FIG. 1, FIG. 7, and FIG. 8, a third embodiment of the present disclosure provides a display panel 01 and a display device. The display panel 01 has a chip bonding region 20, and includes an output terminal group 21, a multiplexer 22, a test terminal group 23, and an input terminal group 24 arranged in sequence in the chip bonding region 20. The display panel 01 further includes an organic layer 140 disposed in the chip bonding region 20, the organic layer 140 includes a first boundary 141 and a second boundary 142. The first boundary 141 is positioned between the multiplexer 22 and the output terminal group 21, a distance is defined between the first boundary 141 and the output terminal group 21, and the distance a is satisfied with a≥30 μm. The second boundary 142 is positioned between the test terminal group 23 and the input terminal group 24, a distance b is defined between the second boundary 142 and the input terminal group 24, and the distance b is satisfied with b≥30 μm. The display device includes a housing and the display panel 01, wherein the housing has an accommodating space in which the display panel 01 is disposed.

It should be noted that the structure of the display panel 01 and the display device provided in the third embodiment of the present disclosure is similar to the structure of the display panel 01 and the display device provided in the second embodiment of the present disclosure, and details of the same parts are not described in third embodiment of the present disclosure.

In the third embodiment of the present disclosure, the virtual terminal group 25 includes a plurality of virtual terminals 251, and the plurality of virtual terminals 251 defines one virtual terminal row, wherein c=d≥80 μm.

In the display panel 01 provided in the present disclosure, since the plurality of virtual terminals 251 defines one virtual terminal row, the virtual terminal row needs to be compressed to function as an auxiliary support during the bonding process of the output terminal and the input terminal. By further increasing the distance between the third boundary 143 and the virtual terminal group 25 and further increasing the distance between the fourth boundary 144 and the virtual terminal group 25, the present disclosure can make improvement on the risk of the film layers peeling caused by the increase deformation of the virtual terminal row due to numbers of compression.

In addition, since the plurality of the virtual terminals 251 defines one virtual terminal row, a layout area of the virtual terminal group 25 can be reduced, thereby further increasing the distance between the third boundary 143 and the virtual terminal group 25 and further increasing the distance between the fourth boundary 144 and the virtual terminal group 25. The peeling problem caused by the virtual terminal 251 in the virtual terminal group 25 being subjected to compression deformation to pull the first boundary 141 can be mitigated, thereby reducing the probability of abnormal chip output signals, and improving the display quality of the display panel 01.

In addition, since the distance c and the distance d are satisfied with c=d, that is, the distance between the third boundary 143 and the output terminal group 21 is equal to the distance between the fourth boundary 144 and the input terminal group 24, it is possible to improve the design consistency of the film layers of the display panel 01, thereby improving of the production efficiency and reducing the production cost of the display panel 01.

Further, the distance a, the distance b, the distance c, and the distance d are satisfied with a=b=c=d.

In the display panel 01 provided in the present disclosure, the distance a, the distance b, the distance c, and the distance d are satisfied with a=b=c=d, that is, the distance between the first boundary 141 and the output terminal group 21, the distance between the second boundary 142 and the input terminal group 24, the distance between the third boundary 143 and the virtual terminal group 25, and the distance between the fourth boundary 144 and the test terminal group 23 are all equal. As such, the consistency of the film layers of the display panel 01 can be improved, the production efficiency can be improved, and the production cost of the display panel 01 can be reduced.

In view of the foregoing, the present disclosure provides a display panel and a display device. The display panel has a chip bonding region, and includes an output terminal group, a multiplexer, a test terminal group, and an input terminal subgroup arranged in sequence in the chip bonding region. The display panel further includes an organic layer disposed in the chip bonding region, and the organic layer including a first boundary and a second boundary. The first boundary is positioned between the multiplexer and the output terminal group, and a distance a is defined between the first boundary and the output terminal group, wherein the distance a is satisfied with a≥30 μm. The second boundary is positioned between the test terminal group and the input terminal group, and a distance b is defined between the second boundary and the input terminal group, wherein the distance b is satisfied with b≥30 μm. The display panel and the display device provided in the present disclosure can make improvement on the peeling of the film layers in the chip bonding region, thereby reducing abnormal chip output signals caused by the peeling of the film layers, and improving the display quality.

The foregoing describes in detail a display panel and a display device according to an embodiment of the present disclosure, and the principles and embodiments of the present disclosure are described herein by specific embodiments and examples. The description of the above embodiments and examples is merely provided to help understand the present disclosure and the core idea thereof. At the same time, variations will occur to those skilled in the art in both the detailed embodiments and applications in accordance with the scopes and teachings of the present disclosure. In view of the foregoing, the present specification should not be construed as limiting the disclosure.

What is claimed is:

1. A display panel, wherein the display has a chip bonding region, and comprises an output terminal group, a multiplexer, a test terminal group, and an input terminal group arranged in sequence in the chip bonding region; the display panel further comprises an organic layer disposed in the chip bonding region, and the organic layer comprises a first boundary and a second boundary;

wherein the first boundary is positioned between the multiplexer and the output terminal group, a distance a is defined between the first boundary and the output terminal group, and the distance a is satisfied with a≥30 μm; and wherein the second boundary is positioned between the test terminal group and the input terminal group, a distance b is defined between the second boundary and the input terminal group, and the distance b is satisfied with b≥30 μm.

2. The display panel of claim 1, wherein no electrostatic protection circuit is provided between the output terminal group and the input terminal group.

3. The display panel of claim 2, wherein the organic layer positioned between the first boundary and the second boundary is continuously provided.

4. The display panel of claim 3, wherein the organic layer positioned between the first boundary and the second boundary is discontinuously provided, wherein the display panel further comprises a virtual terminal group disposed in the chip bonding region, the virtual terminal group is positioned between the multiplexer and the test terminal group, and the organic layer comprises a third boundary and a fourth boundary;

wherein the third boundary is positioned between the multiplexer and the virtual terminal group, a distance c is defined between the third boundary and the virtual terminal group, and the distance c is satisfied with c>m/6, wherein m is a distance between the third boundary and the first boundary;

wherein the fourth boundary is positioned between the test terminal group and the virtual terminal group, and a distance d is defined between the fourth boundary and the test terminal group, and the distance d is satisfied with d>n/6, wherein n is a distance between the fourth boundary and the second boundary.

5. The display panel of claim 4, wherein the virtual terminal group comprises a plurality of virtual terminals, and the plurality of virtual terminals defines a plurality of virtual terminal rows, wherein the distance c and the distance d are satisfied with c=d≥50 μm.

6. The display panel of claim 5, wherein no organic layer is provided between any two adjacent rows of the virtual terminals.

7. The display panel of claim 4, wherein the virtual terminal group comprises a plurality of virtual terminals, the plurality of virtual terminals defines one virtual terminal row, wherein the distance c and the distance d are satisfied with c=d≥80 μm.

8. The display panel of claim 4, wherein the distance a, the distance b, the distance c, and the distance d are satisfied with a=b=c=d.

9. The display panel of claim 1, wherein the organic layer is integrally formed.

10. The display panel of claim 1, wherein the organic layer has a thickness no more than 4 μm.

11. A display device, wherein the display device comprises a housing and a display panel, the housing has an accommodating space, and the display panel is disposed in the accommodating space; wherein the display panel has a chip bonding region, and comprises an output terminal group, a multiplexer, a test terminal group, and an input terminal group arranged in sequence in the chip bonding region; the display panel further comprises an organic layer disposed in the chip bonding region, and the organic layer comprises a first boundary and a second boundary;

wherein the first boundary is positioned between the multiplexer and the output terminal group, a distance a is defined between the first boundary and the output terminal group, and the distance a is satisfied with a≥30 μm; and wherein the second boundary is positioned between the test terminal group and the input terminal group, a distance b is defined between the second boundary and the input terminal group, and the distance b is satisfied with b≥30 μm.

12. The display device of claim 11, wherein no electrostatic protection circuit is provided between the output terminal group and the input terminal group.

13. The display device of claim 12, wherein the organic layer positioned between the first boundary and the second boundary is continuously provided.

14. The display device of claim 13, wherein the organic layer positioned between the first boundary and the second boundary is discontinuously provided;

wherein the display panel further comprises a virtual terminal group disposed in the chip bonding region, the virtual terminal group is positioned between the multiplexer and the test terminal group, and the organic layer comprises a third boundary and a fourth boundary;

wherein the third boundary is positioned between the multiplexer and the virtual terminal group, a distance c is defined between the third boundary and the virtual terminal group, and the distance c is satisfied with c>m/6, wherein m is a distance between the third boundary and the first boundary;

wherein the fourth boundary is positioned between the test terminal group and the virtual terminal group, and a distance d is defined between the fourth boundary and the test terminal group, and the distance d is satisfied with d>n/6, wherein n is a distance between the fourth boundary and the second boundary.

15. The display device of claim 14, wherein the virtual terminal group comprises a plurality of virtual terminals, and the plurality of virtual terminals defines a plurality of virtual terminal rows, wherein the distance c and the distance d are satisfied with c=d≥50 μm.

16. The display device of claim 15, wherein no organic layer is provided between any two adjacent rows of the virtual terminals.

17. The display device of claim 14, wherein the virtual terminal group comprises a plurality of virtual terminals, the plurality of virtual terminals defines one virtual terminal row, wherein the distance c and the distance d are satisfied with c=d≥80 μm.

18. The display device of claim 14, wherein the distance a, the distance b, the distance c, and the distance d are satisfied with a=b=c=d.

19. The display device of claim 11, wherein the organic layer is integrally formed.

20. The display device of claim 11, wherein the organic layer has a thickness no more than 4 μm.

* * * * *